(12) United States Patent
Sarin et al.

(10) Patent No.: US 12,301,248 B2
(45) Date of Patent: May 13, 2025

(54) METHODS AND SYSTEMS OF UTILIZING ANALOG TO DIGITAL CONVERTER (ADC) FOR MULTIPLY-ACCUMULATOR (MAC)

(71) Applicants: Vishal Sarin, Saratoga, CA (US);
Biprangshu Saha, Bangalore (IN);
Sankha Saha, Santa Clara, CA (US);
Vikram Kowshik, Cupertino, CA (US);
Sang T. Nguyen, Union City, CA (US);
Siraj Fulum Mossa, San Jose, CA (US)

(72) Inventors: Vishal Sarin, Saratoga, CA (US);
Biprangshu Saha, Bangalore (IN);
Sankha Saha, Santa Clara, CA (US);
Vikram Kowshik, Cupertino, CA (US);
Sang T. Nguyen, Union City, CA (US);
Siraj Fulum Mossa, San Jose, CA (US)

(*) Notice: Subject to any disclaimer, the term of this patent is extended or adjusted under 35 U.S.C. 154(b) by 93 days.

(21) Appl. No.: 18/231,214

(22) Filed: Aug. 7, 2023

(65) Prior Publication Data

US 2024/0128979 A1    Apr. 18, 2024

Related U.S. Application Data

(60) Provisional application No. 63/395,470, filed on Aug. 5, 2022.

(51) Int. Cl.
*H03M 1/12*      (2006.01)
*G06F 7/544*     (2006.01)
*H03K 3/037*     (2006.01)
*H03M 1/00*      (2006.01)
*H03M 1/48*      (2006.01)

(52) U.S. Cl.
CPC ............ *H03M 1/12* (2013.01); *G06F 7/5443* (2013.01); *H03K 3/0372* (2013.01); *H03M 1/00* (2013.01); *H03M 1/48* (2013.01)

(58) Field of Classification Search
CPC . H03M 1/12; H03M 1/00; H03M 1/48; G06F 7/5443; H03K 3/0372
See application file for complete search history.

(56) References Cited

U.S. PATENT DOCUMENTS

2008/0198050 A1* 8/2008 Akizuki .............. H03M 7/3015
341/143

* cited by examiner

*Primary Examiner* — Joseph J Lauture

(57) ABSTRACT

In one aspect, an analog to digital converter (ADC) for a multiply-accumulator (MAC) system comprising: an ADC control that receives a VREF and generates a plurality of timing signals to an ADC, and wherein the plurality of timing signals comprises an S1 signal, an S3 signal, an S4 signal, an ECO signal, a CLOCK signal, and a COUNTER<N:0> signal; the ADC that comprises: a pre-charge system comprising a sense capacitor that stores an integrated charge IMAC over a time T and develops voltage VMAC, and wherein the S1 signal defines the pre-charge phase of the sense capacitor.

16 Claims, 11 Drawing Sheets

```
┌─────────────────────────────────────────────────────────┐
│  SENSE NODE RAMP UP IS ACHIEVED DURING ADC RESOLUTION PHASE │
│  BY PLACING SENSE NODE A HIGH -Z STATE AND RAMPING UP NODE  │
│                          GNDX                               │
│                          802                                │
└─────────────────────────────────────────────────────────┘
                              │
                              ▼
┌─────────────────────────────────────────────────────────┐
│  TRANSFER RAMP OF GNDXI TO GNDX IRRESPECTIVE OF PARASITIC CAP│
│             ON THE GNDX ISOLATION DEVICE                    │
│                          802                                │
└─────────────────────────────────────────────────────────┘
```

FIGURE 8

METHODS AND SYSTEMS OF UTILIZING ANALOG TO DIGITAL CONVERTER (ADC) FOR MULTIPLY-ACCUMULATOR (MAC)

BACKGROUND

1. Field

This application relates generally to electronic circuits, and more particularly to a system, method, and article of manufacture of utilizing analog to digital converter (ADC) for multiply-accumulator (MAC).

2. Related Art

An ADC can provide various challenges. The present discussion can refer to the ADCs of FIG. 5 infra of which FIGS. 1-4 and 8 provide a MAC ADC inventive solution thereto. FIG. 5 is based on the prior art "Dual Slope ADC". In FIG. 5, the input charge stored in the capacitor C1 404 during charge accumulation phase, according to some embodiments. The corresponding potential across Cl 404 represents the analog voltage $V_{MAC}$ with respect to ground at the end of the accumulation phase (shown in FIG. 5). As per working of Dual Slope ADC, The sense cap C1 404 is made to ramp with reference constant slope till the initial voltage. And the constant slope is created by the reference current source $I_{REF}$ 401.

A capacitor C1 404 may have a tradeoff between, inter alia: capacitance value, size (e.g. area), voltage swing for a given input and capacitor voltage rating and operating voltage. A smaller size capacitor, hence smaller capacitance, is preferable to make the system under realization for given area constraint. A smaller capacitor causes large voltage swing across it for a given input during voltage development phase. Additionally, a higher voltage swing may diminish the voltage head room for the current mirror to generate constant $I_{REF}$ for a given operating voltage. An operating voltage may need to be increased to improve the current source voltage head room. However, a higher operating voltage may need capacitors with a higher voltage rating—may cause capacitance to go down.

With the above constraint, to keep the capacitor size under realization, maximum voltage swing across may be preferred. Large voltage swing makes the $I_{REF}$ 401 current source to be realized with cascade current mirror. Therefore, a larger size for transistors may be required to realize the current mirror. The area requirement is even higher when multiple ADCs are required for a system as shown in FIG. 7. In FIG. 7 we do see multiple ADC in FIG. 4 has been to use to implement the required system. $I_{REF}$ current source is used for every ADC 404A to 404N.

Ideally, the resolution phase may come into action when switch S4 is closed, hence sense node ramps up towards $V_{REF}$ as $I_{REF}$ is made to charge the sense cap. However, in reality the current mirror may need significant time to settle to its intended constant current value. Therefore, current mirror may need to be in an ON state before the S4 is closed and the derived current may need to be bypassed to ground. Hence, the extra power consumption. Power consumption appears in many folds when multiple such ADC is required as shown in FIG. 7.

SUMMARY OF THE INVENTION

In one aspect, an analog to digital converter (ADC) for a multiply-accumulator (MAC) system comprising: an ADC control that receives a $V_{REF}$ and generates a plurality of timing signals to an ADC, and wherein the plurality of timing signals comprises an S1 signal, an S3 signal, an S4 signal, an ECO signal, a CLOCK signal, and a COUNTER<N:0> signal; the ADC that comprises: a pre-charge system comprising a sense capacitor that stores an integrated charge IMAC over a time T and develops voltage $V_{MAC}$, and wherein the S1 signal defines the pre-charge phase of the sense capacitor, wherein the sense capacitor is pre-charged to a higher reference voltage $V_{REF}$ before the discharge phase occurs by the IMAC current, an isolation/circuit device, wherein the isolation/circuit device is controlled by signal S3, wherein a turned-on isolation device enables the sense capacitor C1 pre-charge to occur though itself and enables a path for the IMAC current to discharge the sense capacitor C1, wherein during the pre-charge and charge accumulation phase isolation the sense capacitor C1 is expected to be turned on, and wherein the isolation device isolates sense capacitor C1 from the pre-charge system, a device controlled by the signal S4, wherein the signal S4 transitions from a logic high state to a logic low state which turns off device in order to start the resolution phase, a sense node of the sense capacitor C1, wherein the sense node follows a GNDX constant ramp of the ADC control unit at a resolution phase such that when the S3 is also in the logic low state the sense node is at a high impedance, a comparator which compares the sense node voltage with $V_{REF}$, can detect and generate an active low output when sense node of the sense capacitor C1 ramps back to the $V_{REF}$ voltage during resolution phase, a CMOS logic-based system that received the output of the comparator output, wherein an active high output transition of CMOS logic-based system comprises a detection event when the sense node of sense cap ramps back to $V_{REF}$ during the resolution phase, wherein the CMOS logic-based system detects an ADC output even if there is zero input to the ADC, and wherein the CMOS logic-based system ensures a specified ADC output when the input goes beyond a range instead of a random ADC output, and a Master Slave Flip Flop that synchronizes an output of the CMOS logic-based system, and wherein the Master Slave Flip Flop generates a pulse with pulse-width sufficient to latch a counter data and produce the binary ADC output.

BRIEF DESCRIPTION OF THE DRAWINGS

FIG. 8 illustrates an example operation of the design presented in FIG. 1, according to some embodiments.

Figure 1A:
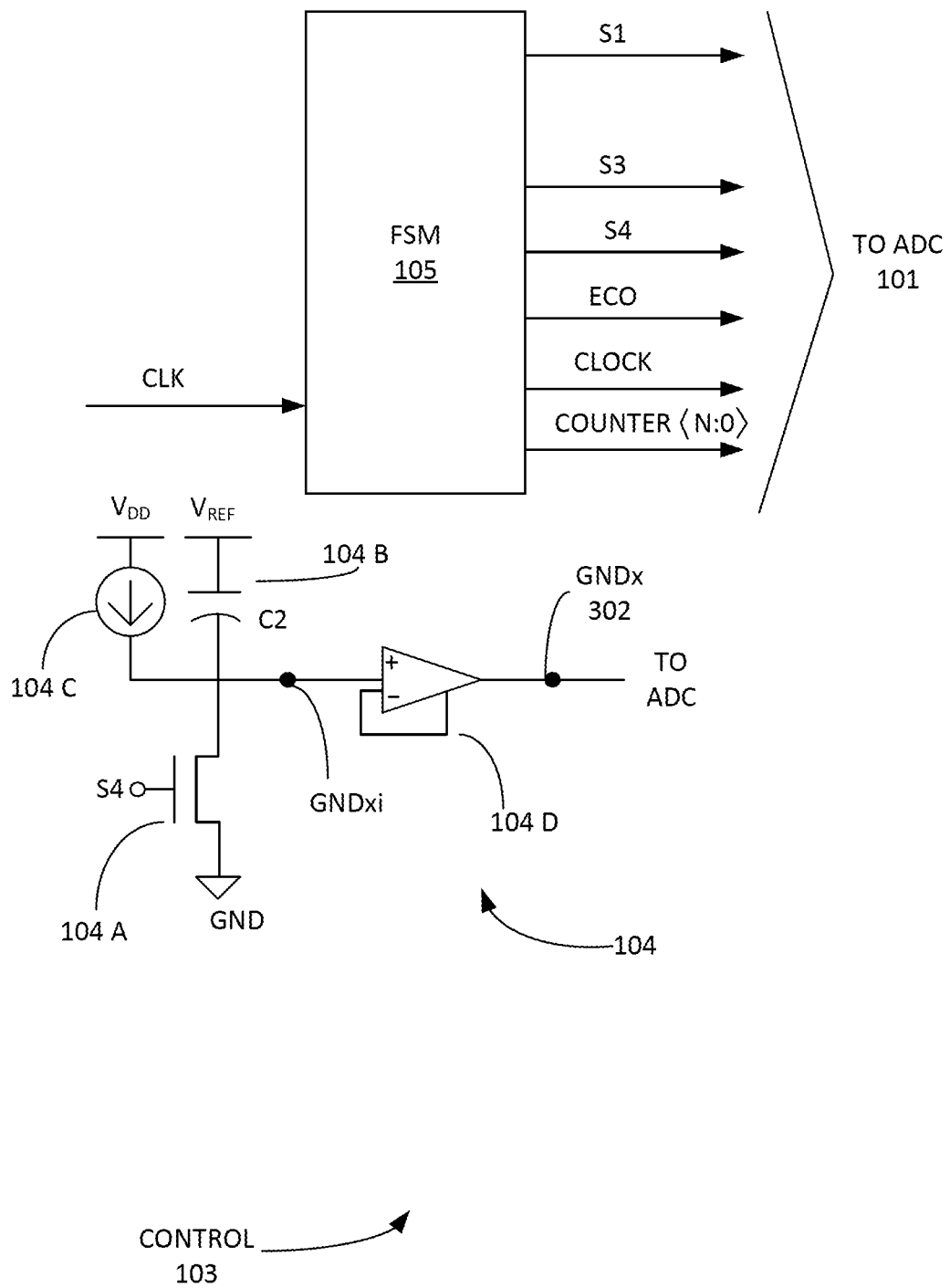
FIGS. 1A-D illustrate an example first ADC system with an ADC and ADC control, according to some embodiments.

The Figures described above are a representative set and are not an exhaustive with respect to embodying the invention.

DESCRIPTION

Disclosed are a system, method, and article of manufacture of utilizing analog accumulator and analog to digital converter (ADC) for Analog multiply-accumulator (MAC). The following description is presented to enable a person of ordinary skill in the art to make and use the various embodiments. Descriptions of specific devices, techniques, and applications are provided only as examples. Various modifications to the examples described herein can be readily apparent to those of ordinary skill in the art, and the general principles defined herein may be applied to other examples and applications without departing from the spirit and scope of the various embodiments.

Reference throughout this specification to 'one embodiment,' 'an embodiment,' 'one example,' or similar language means that a particular feature, structure, or characteristic described in connection with the embodiment is included in at least one embodiment of the present invention. Thus, appearances of the phrases 'in one embodiment,' 'in an embodiment,' and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, and they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Definitions

Example definitions for some embodiments are now provided.

Analog-to-digital converter (ADC) is a system that converts an analog into a digital signal.

Current mirror can be a circuit designed to copy a current through one active device by controlling the current in another active device of a circuit, keeping the output current constant regardless of loading.

Integrator can be an element whose output signal is the time integral of its input signal. It can accumulate the input quantity over a defined time to produce a representative output.

Multiply-accumulator (MAC) is an analog compute blocks which does multiplication and accumulation in analog domain using memory cells. The input and output of the MAC block can be digital or analog. The input and outputs are in the digital domain in the preferred embodiment.

GND refers to the universal Ground connection in electrical engineering. It is the reference point and represents a Zero potential for the entire circuit under discussion.

N-type metal-oxide-semiconductor logic uses n-type (−) MOSFETs (metal-oxide-semiconductor field-effect transistors) to implement logic gates and other digital circuits. nMOS transistors operate by creating an inversion layer in a p-type transistor body. This inversion layer, called the n-channel, can conduct electrons between n-type source and drain terminals. The n-channel is created by applying voltage to the third terminal, called the gate. nMOS transistors have four modes of operation: cut-off (or subthreshold), triode, saturation (sometimes called active), and velocity saturation.

Operational amplifier (herein 'op amp') can be a DC-coupled high-gain electronic voltage amplifier with a differential input an n-ended output (e.g. a single-ended output).

Parasitic element is a circuit element that is possessed by an electrical component but which it is not desirable for it to have for its intended purpose.

Example Computer Architecture and Systems

FIGS. 1A-D illustrate an example first ADC system 100 with an ADC 101 and ADC control 103, according to some embodiments. ADC 101 can be used for an analog MAC. As used herein, MAC can be defined as Multiplication plus Accumulation. ADC 101 stores the accumulated charge in a capacitor. The capacitor voltage $V_{MAC}=(1/C)*(i1\ t1+i2\ t2+i3\ t3\ldots$ and so on) which is proportional to the stored charge is then converted to digital output. An analog MAC can use multiple ADCs for N number of $\{i_1\ t_1+i_2\ t_2+i_3\ t_3\ldots\}$ sets produced by the N number of analog multiplier array 102.

ADC system 100 includes ADC 101. ADC 101 includes sense capacitor 122 whose capacitance denoted by C. Sense capacitor 122 stores an integrated charge $I_{MAC}$ over a time T and develops voltage across it $V_{MAC}=(1/C)I_{MAC}*T$.

Figure 1B:
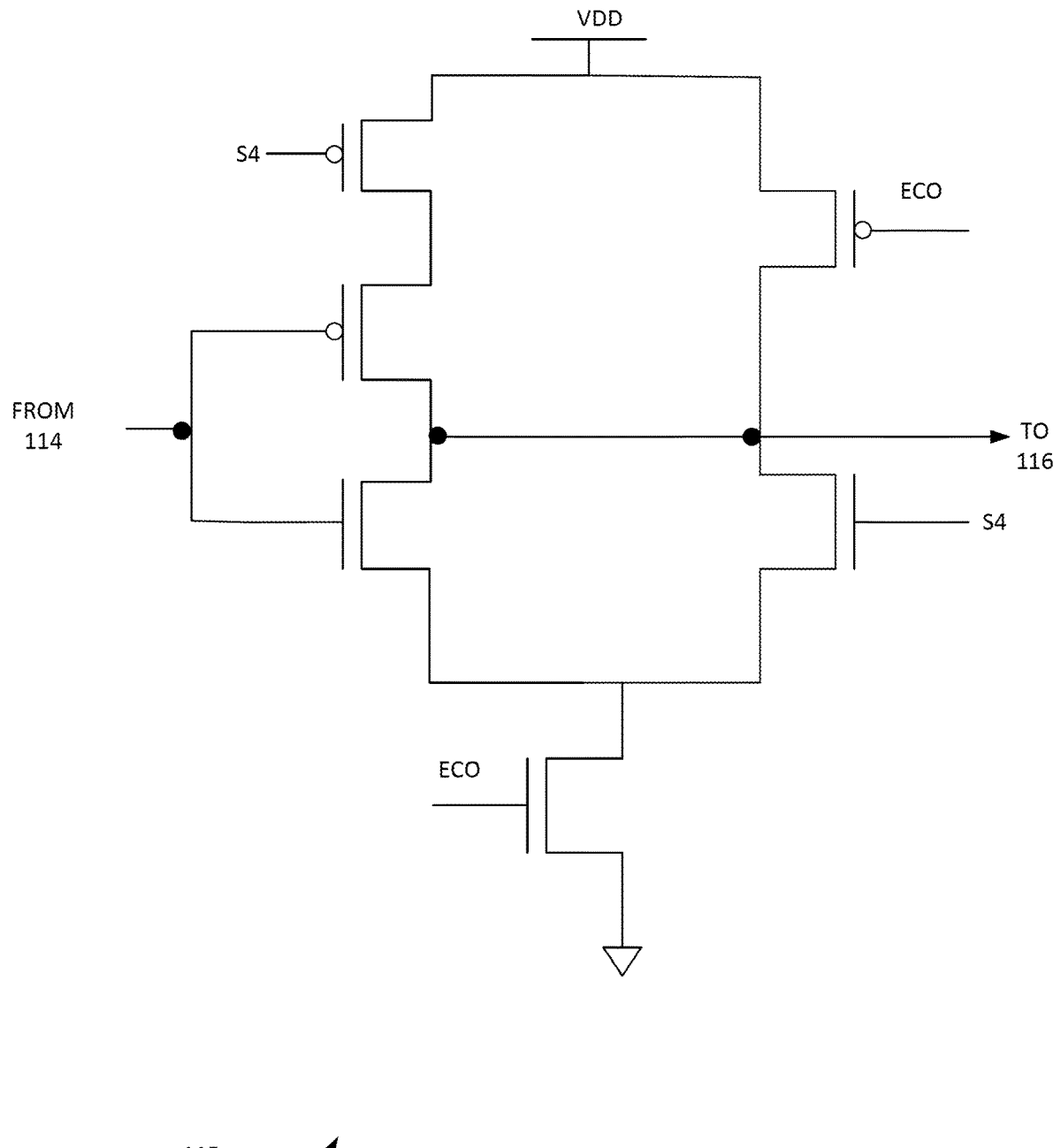
Figure 1C:
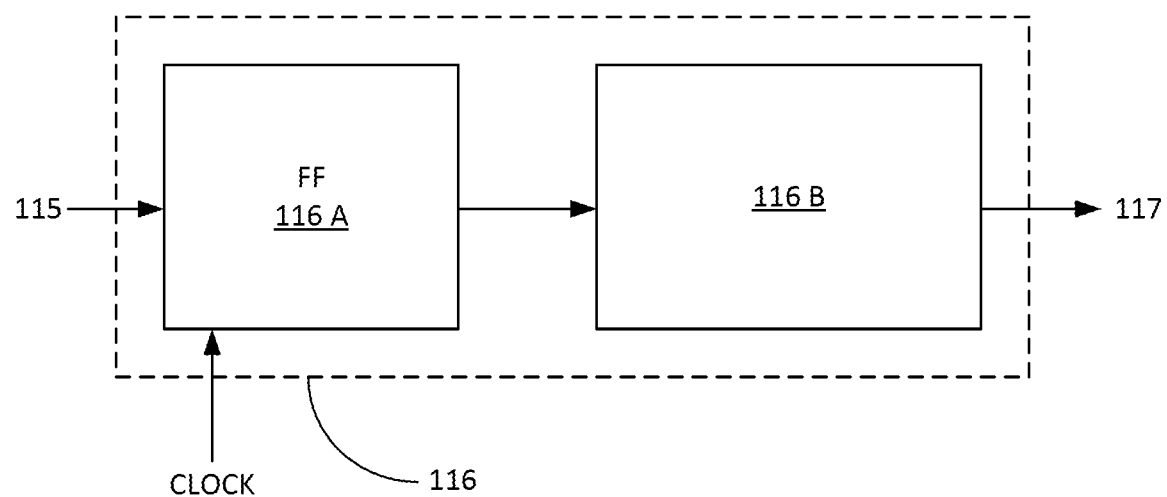
Figure 2:
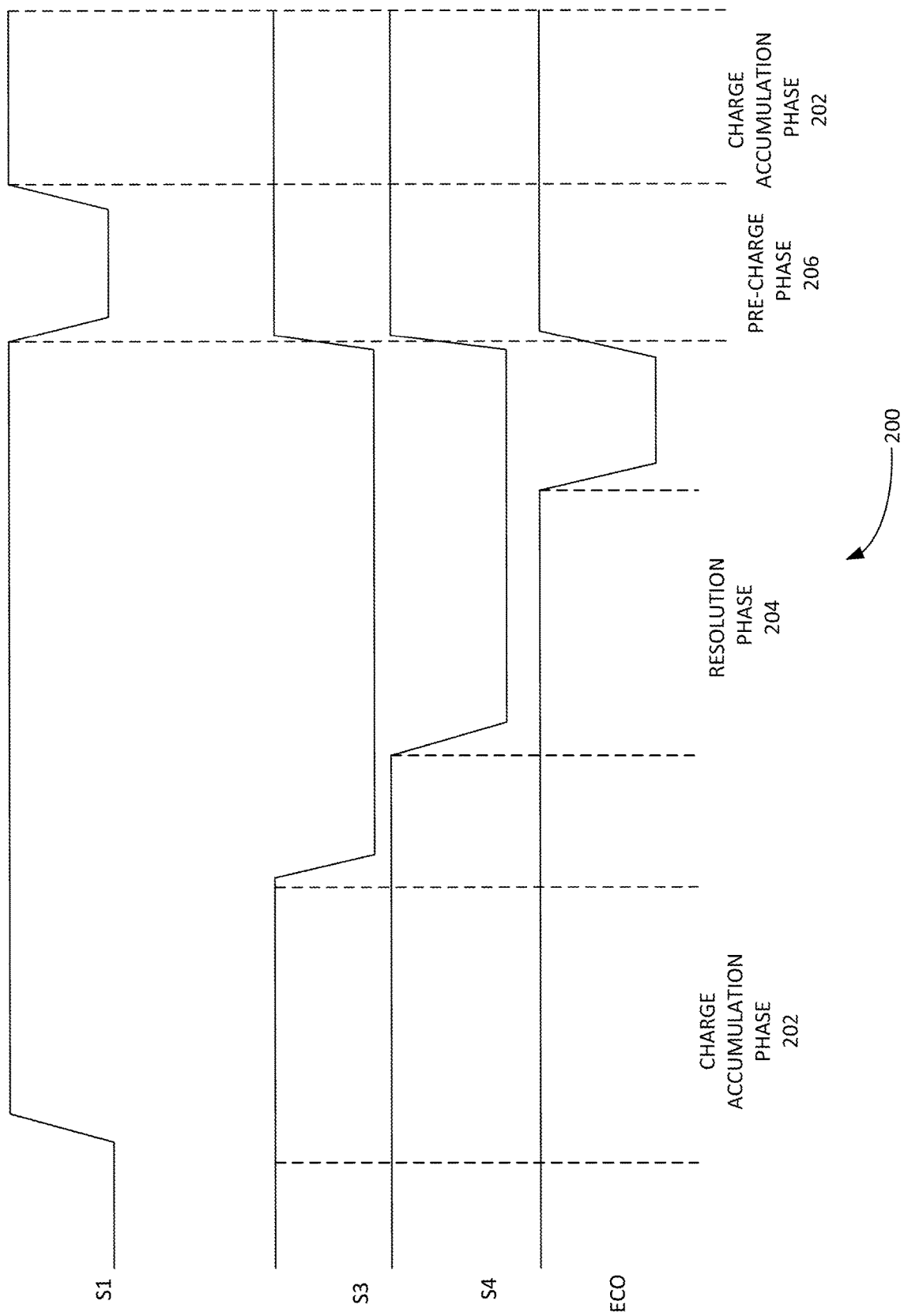
FIG. 2 illustrates timing diagram for the control signal to make the system 100 to function.

ADC 101 can include a pre-charge system 111 as shown in FIG. 1C. The $I_{MAC}$ current 108 is a syncing current which discharges the sense cap 122 to develop the voltage $V_{MAC}$ across it, the capacitor 122 can be pre-charged to some higher reference voltage $V_{REF}$ before the discharge phase named as charge accumulation phase can actually take place by the input $I_{MAC}$ current 108. Signal S1 defines the pre-charge phase as shown in FIG. 2 timing diagram discussed infra.

ADC 101 can include an isolation/circuit device 112 controlled by signal S3. The isolation device can use a nMOS. A turned-on isolation device 112 enables the sense cap pre-charge to take place though itself and enables a path for the $I_{MAC}$ current 108 to discharge sense capacitor C1 122 as well. During the pre-charge and charge accumulation phase isolation device 112 is expected to be turned on with S3 at a high state. On the other hand, the Isolation device 112 isolates sense capacitor C1 122 from pre-charge system 111, as S3 is logic low, turning the sense node at high impedance state.

ADC 101 can include a device 113 controlled by signal S4. Device 113 can employ an nMOS transistor. Signal S4 can transition from logic high to low which turns off device 113. This can lead to the start of the resolution phase. It is noted that the same signal S4 has also been used in control system 103. At a pre-charge phase and a charge accumulation phase the turned-on device (e.g. S4 is high) 113 connects/ties the bottom plate (marked as GNDX) of the sense cap 122 at GND. At the start of resolution phase the transition of S4 from high to low i) initiates a constant ramp on the net GNDX potential, and ii) disconnects the sense cap from GND. As a result, the sense node follows the GNDX constant ramp at the resolution phase. It is noted that S3 is also logic LOW during this phase which makes the sense node high impedance, hence the sense node ramp is possible.

Comparator 114, which compares the sense node voltage with $V_{REF}$, can detect and generate an active low output when sense node of sense cap 122 ramps back to the $V_{REF}$ voltage during resolution phase.

System 115 can use CMOS logic as shown in FIG. 1B. Comparator 114 output is fed to CMOS logic 115. The active high output transition of 115 is considered as detection event when sense node of sense cap 122 ramps back to $V_{REF}$ during resolution phase. System 115 performs two important role i) It ensures successful detection and ADC output even if there is Zero input to the ADC ii) It ensures best possible ADC output if the input goes beyond the range instead of a random ADC output.

The active high output of the system 115 is asynchronous in nature with respect to the clock. System 116 may use a Master Slave Flip Flop 116A to synchronize the 115 outputs. system 116B generates a pulse with pulse-width sufficient to latch the counter data. The pulse finally is used to latch the counter data and produce the binary ADC output.

The ADC 101 employs D-Latch 117. The pulse generated by the 116 can be used to latch the counter data generated by the control unit 103. The latched output is marked as ADC output.

FIG. 1A illustrates a control unit 103, according to some embodiments. Control unit can employ a finite state machine (FSM) system 105 to generate timing signals as represented in FIG. 2 discussed infra. FSM 105 uses a continuous clock signal "CLK" as an input and generates CLOCK op only at resolution phase to be used by the system 101. FSM 105 include N bit counter whose output COUNTER<N:0> can be used in the ADC 101. Most importantly it needs to include system 104 consists of 104 A-D. System 104 ramps the net GNDX at the resolution phase. System 104 can use a capacitor C2 104B. One plate of the capacitor C2 104B connected to $V_{REF}$ and the other plate named as GNDXi is ramped up with a constant slope defined by $I_{REF}$ 104C. A unity follower system 104D may employ an operation-amplifier-based unity gain buffer.

Figure 1D:
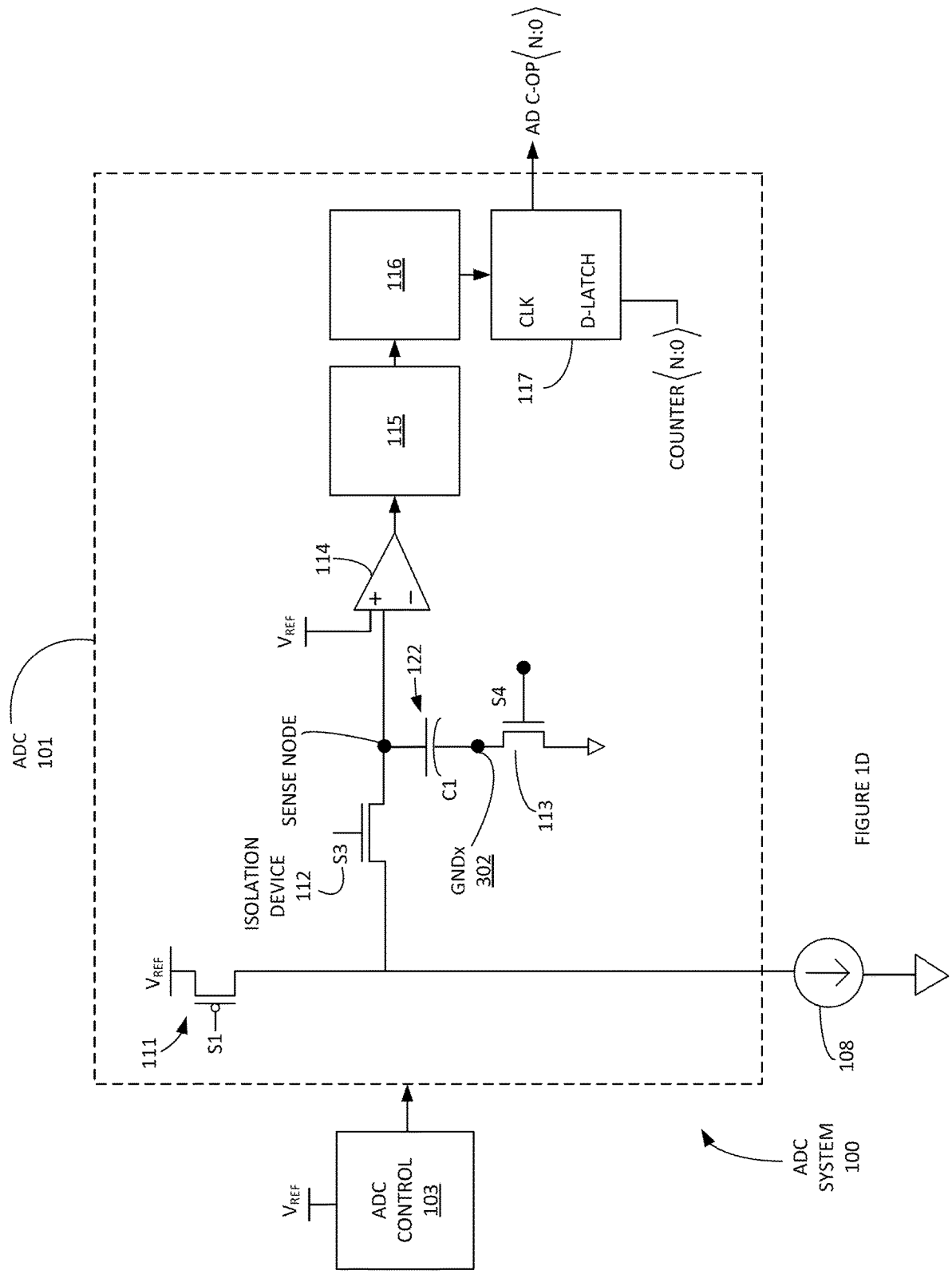

This section describes the relation between sense cap C1 122 in FIG. 1D and capacitor C2 104B in FIG. 1A. The sense cap may go under large swing of voltage across it at charge accumulation phase and/or voltage development phase. In this way, the capacitance of the sense cap C1 can vary monotonically for various reason over the voltage swing range across the capacitor. The error due to the variation of capacitance can be neutralize by having similar variation during resolution phase as well. The charge accumulation phase occurs on Sense cap Cl, while the ramp in resolution phase takes place on capacitor C2 in control unit. Accordingly, it can be easy to understand to provide best solution, the system of FIGS. 1A-D can employ similar cap at both places C1 and C2 and may ensure the similar voltage swing across C1 and C2 at charge accumulation and resolution phase respectively. To achieve this, C2 connection may use the top plate tied at $V_{REF}$ potential while the bottom undergoes the reference ramp. Cl initial voltage is $V_{REF}$ and swings to $V_{MAC}$ in a charge accumulation phase. C2 can have an initial voltage of $V_{REF}$ and can swing to $V_{MAC}$ until a detection occurs in a resolution phase.

FIG. 1D illustrates an example overview of ADC system 100, according to some embodiments. As shown, ADC system 100 includes the systems of FIGS. 1A-C discussed supra.

FIG. 2 illustrates the control signals timing diagram, according to some embodiments. S1 and S2 transition from low to high initiate the charge accumulation phase. At this point the sense cap 122 is assumed to be pre-charged at $V_{REF}$ when the signal S1 and S2 transits from low to high. It is noted that signals S3 and S4 are high so $I_{MAC}$ current 108 can discharge the sense cap 122 and develop $V_{MAC}$. Charge accumulation phase ends with S3 and S4 transits high to low. S3 transition is followed by S4 transition to recover the error caused due to coupling voltage induced to the sense cap by the S3 transition. S3 transition high to low isolates the sense cap from pre-charge 111 (and/or an integrator system), leaving sense node at floating or high impedance state. S4 transition high to low initiates the resolution phase. S4 transition disconnects the sense cap bottom plate from GND, while the top plate sense-node is already isolated and starts ramping up GNDXi/GNDX 302. Eventually the floating sense node of sense cap also follows the GNDX ramp.

The signal ECO is employed to represent end-of-conversion. If due to some unexpected issue $I_{MAC}$ current 108 is high enough to cause the sense cap to discharge and develops $V_{MAC}$ beyond the designed range of the ADC, the sense node may not reach back to $V_{REF}$ in the resolution phase 204. As a result, systems 114, 115 and 116 may not generate the pulse at all to latch N bit counter data, hence the ADC may result spurious output. The best possible result for this situation is to produce max value of the N-bit counter=1111 . . . 11. Signal ECO can ensure this occurs. At the end of the resolution phase N-bit counter reaches to max value and stays here till the next cycle, ECO makes an active low pulse at the end of resolution phase 204 which intern make the output of system 115 to go high and eventually it forms a pulse which latches the max counter data=1111 . . . 11 as an ADC output.

Figure 3:
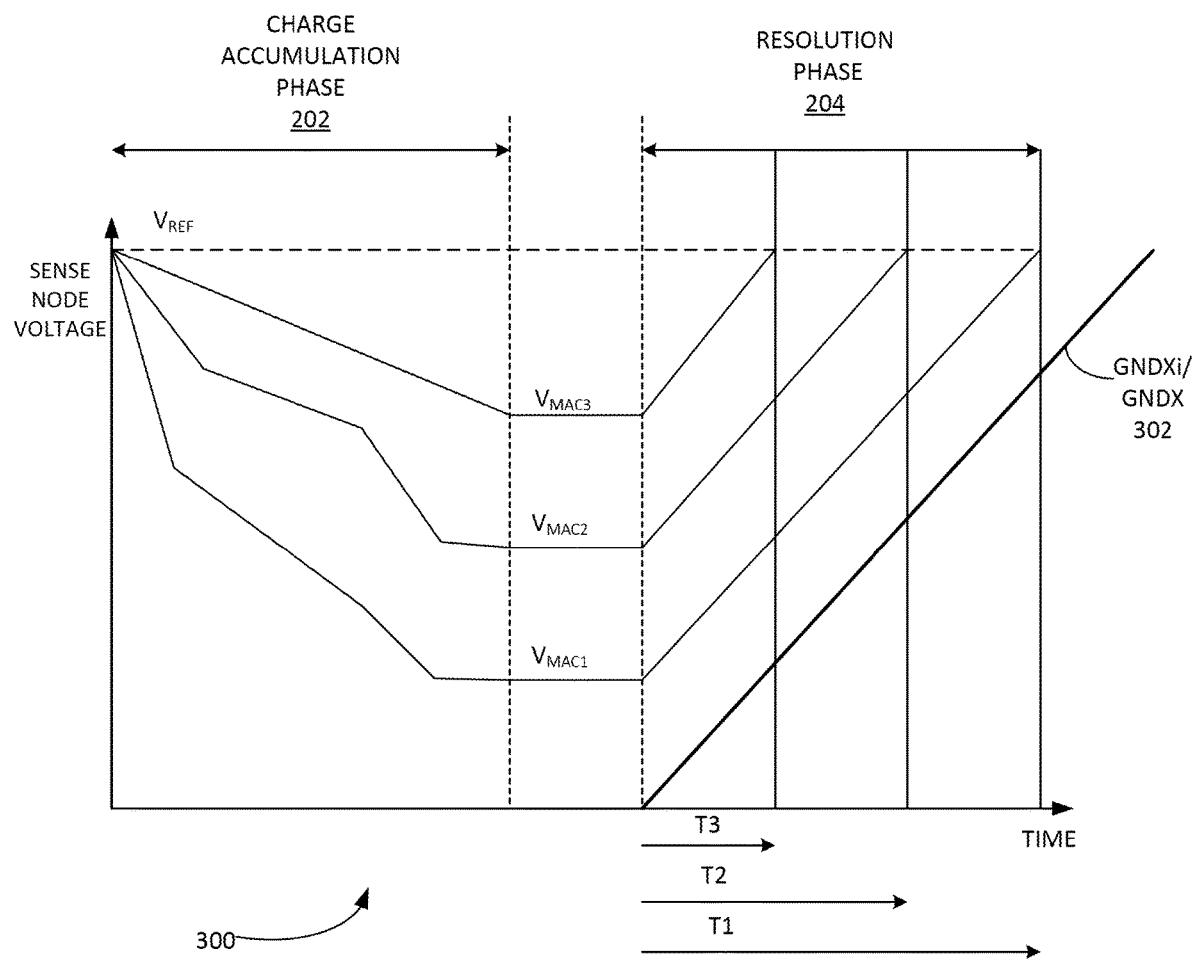
FIG. 3 illustrates an example explanation curve(s) for an Operation of the ADC depicted under invention in FIG. 1, according to some embodiments.

FIG. 3 illustrates an example explanation curve(s) for an ADC Operation, according to some embodiments. FIG. 3 illustrates an example curve for the sense voltage at charge accumulation phase and resolution phase. At the accumulation phase the accumulated charge can be termed as=i1*t1+i2*t2+i3*t3 . . . , which eventually develops $V_{MAC}$ across sense cap 122. For different values of "i" and "t" we do observe different $V_{MAC}$ development across the sense capacitor 122 in development phase as shown by $V_{MAC1}$, $V_{MAC2}$, $V_{MAC3}$. The sense node voltage then ramped to $V_{REF}$ by ramping up the bottom plate of the capacitor 122, named and GNDX, with constant slope and while the top plate is at high impedance state. T is the time taken to ramp the sense node from $V_{MAC}$ to $V_{REF}$. As a result, the sense node reaches to $V_{REF}$ at different time T1, T2, T3 for $V_{MAC1}$, $V_{MAC2}$, $V_{MAC3}$ respectively. T is proportional to accumulated charge, can then be converted to digital output as an ADC output.

Figure 5:
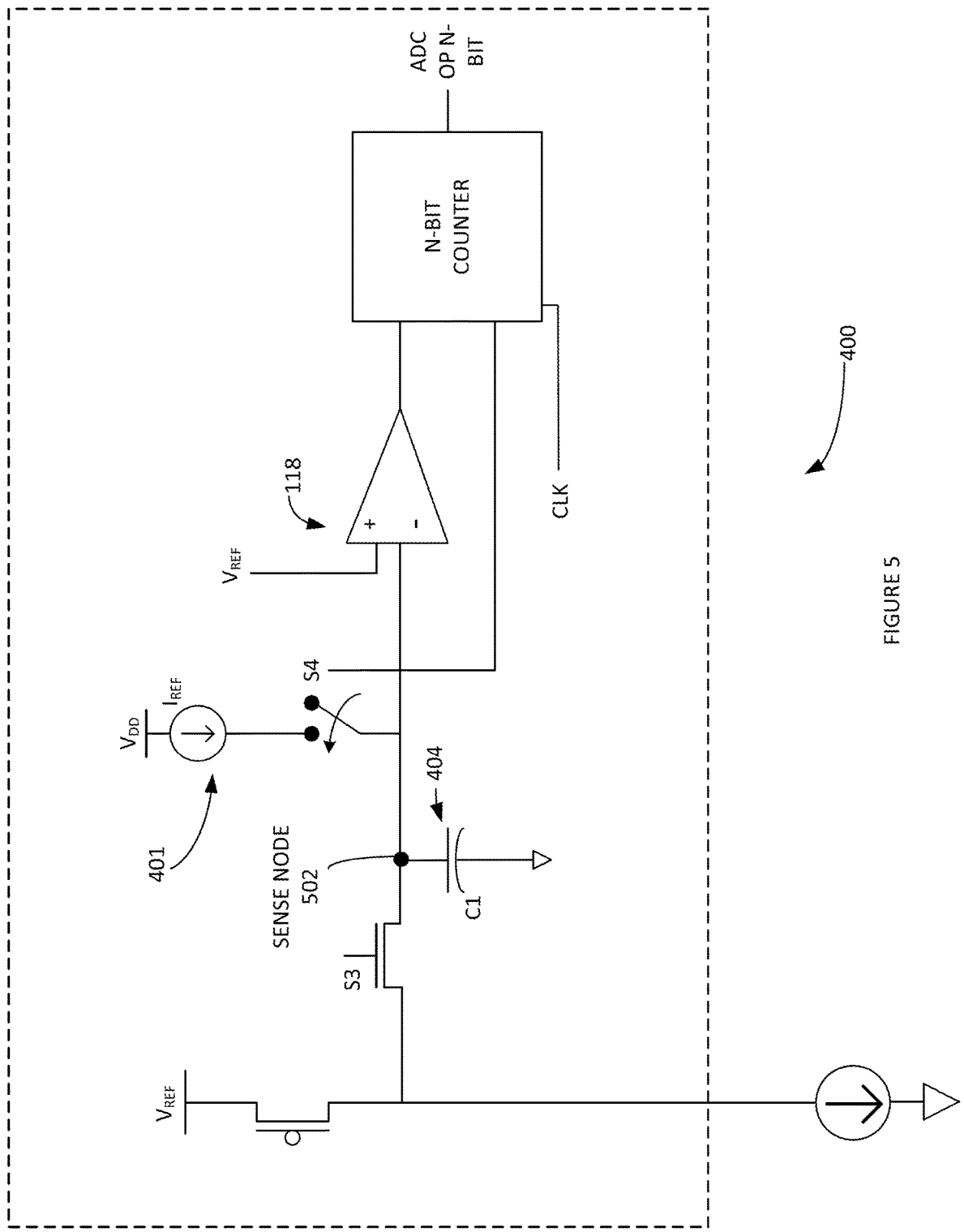
FIG. 5 illustrates an example schematic of a related work and ADC system in conjunction with analog MAC (but not limited to), according to some embodiments.
Figure 6:
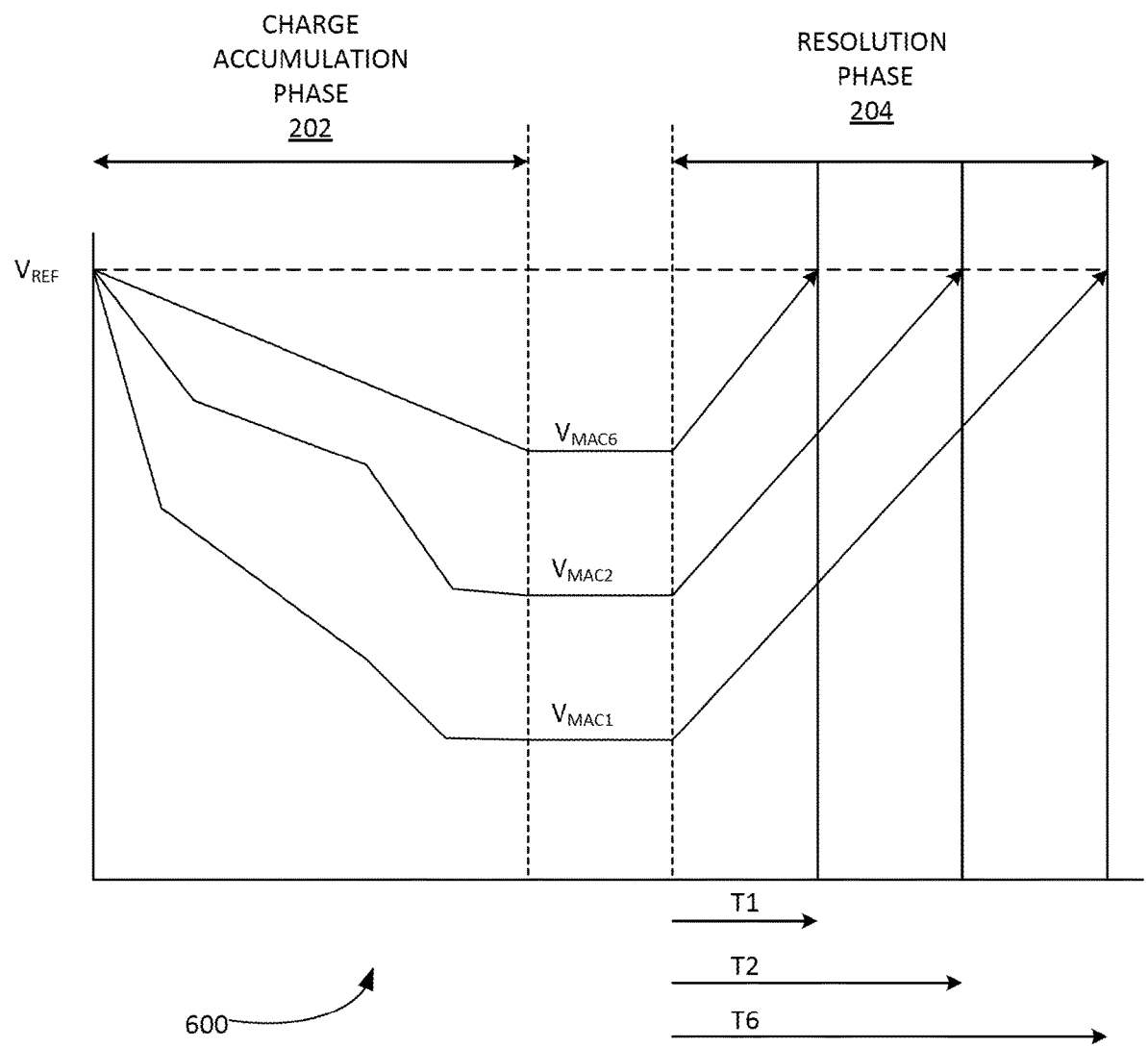
FIG. 6 illustrates an example ADC explanation curve for the ADC in FIG. 5, according to some embodiments.
Figure 7:
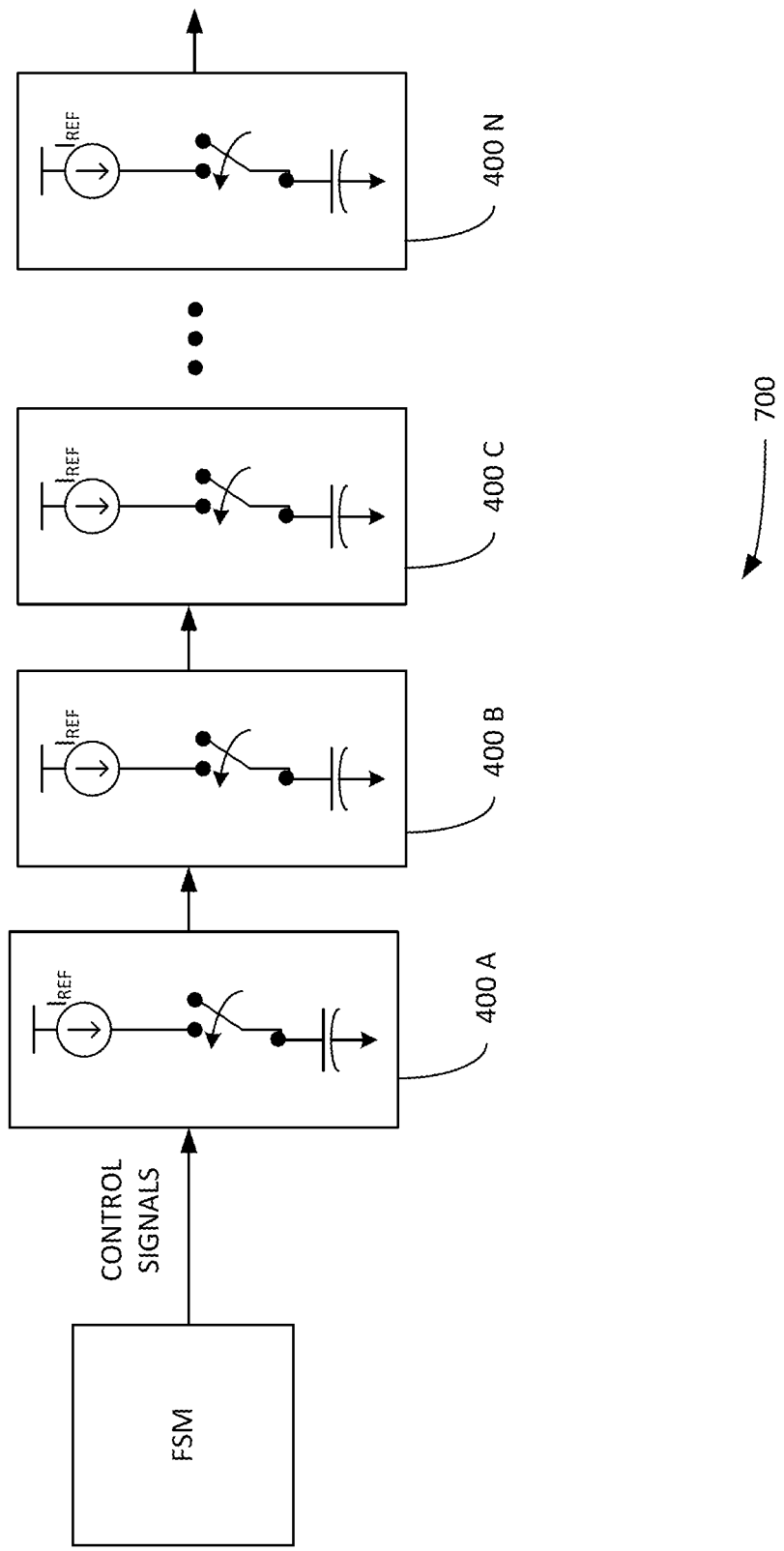
FIG. 7 illustrates a system of N number of ADCs represented in FIG. 5, according to some embodiments.

It is noted that the sense node of sense cap 122 of FIGS. 1A-D ramp up during resolution is achieved by ramping the bottom plate GNDX maintaining same voltage across the sense cap, unlike charging the sense cap 404 itself as depicted in FIGS. 5, 6 and 7 in case of related art.

Figure 4:
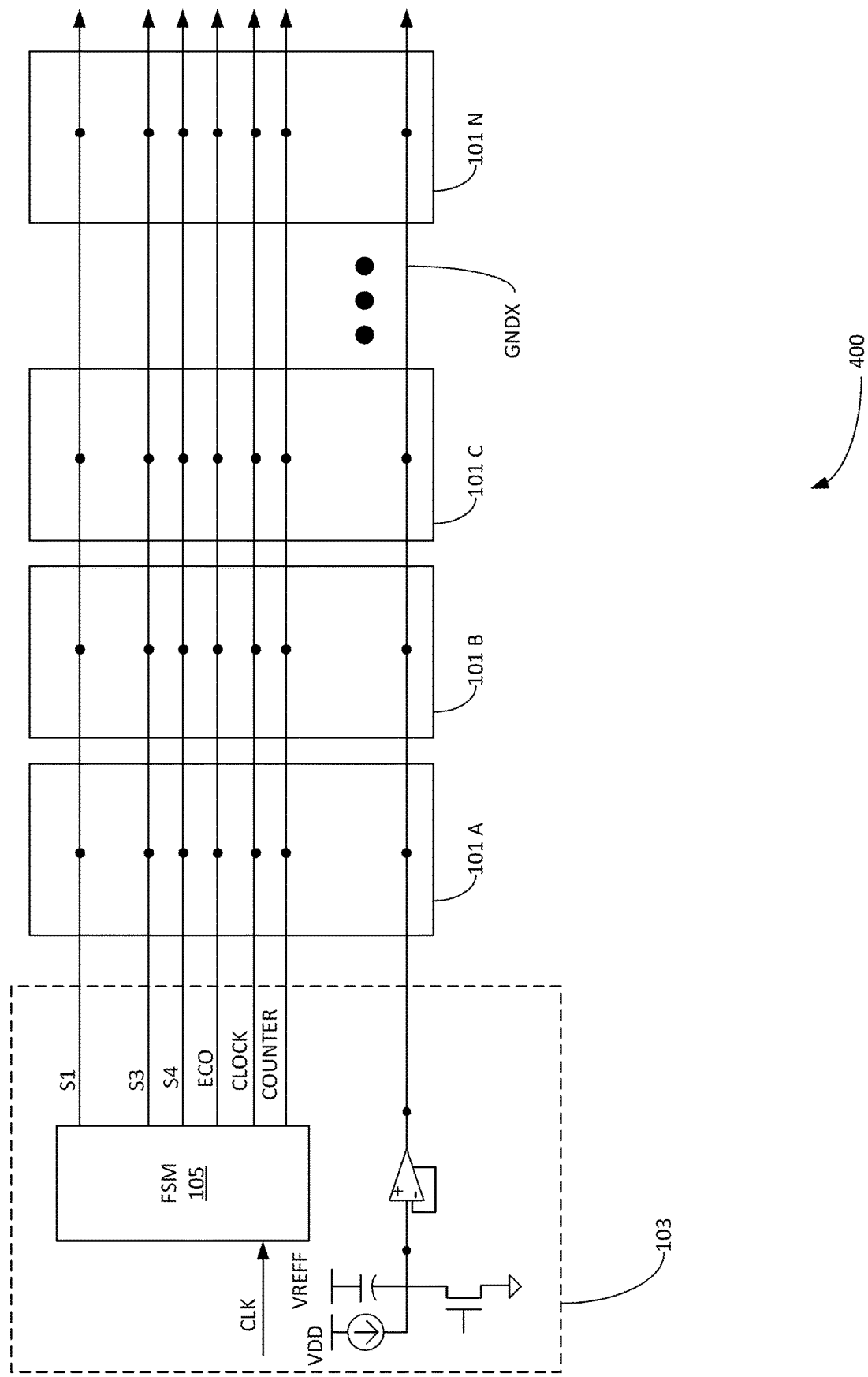
FIG. 4 illustrates a system of N number of ADCs represented in FIG. 1, according to some embodiments.

FIG. 4 illustrates a system 200 of N number of ADCs, according to some embodiments, is a multiple ADC figure. System 200 adds n-number of ADCs. The N-number of ADCs can perform multiple ADC operation for each analog multiplier array 102, with only a single unit of ADC control 204 which employs a single current source $I_{REF}$ in contrast FIG. 7 which uses N number of $I_{REF}$ for N number of ADCs. A single unit of FSM with single unit Counter is sufficient to operate N number of ADC all together for different set of inputs.

FIG. 8 illustrates an example ADC for MAC process 800, according to some embodiments. It is noted that process 800 can be implemented in addition to the processes and systems discussed in FIGS. 1A-D.

In step 802, the sense node ramp up is achieved during ADC resolution phase by making the sense node a High-Z state and ramping up the node GNDX. To realize steps 802 and 804, process 800 can cause C1 to provide a high-Z with S1 open. C2 can be used in conjunction with I3 to ramp up GNDX. During the ADC resolution phase S3 is closed (e.g. and S1 and S2 are open) allowing the current I3 to flow into the C2, hence GNDXI ramp up is achieved.

It is noted that the GNDX node can loaded with parasitics. Accordingly, in step 804, process 800 can transfer the ramp of GNDXI to GNDX irrespective of parasitic cap on the GNDX isolation device O3. As the GNDX ramps up in resolution phase the sense node (red line in waveform)ramp up follows it.

It is noted that Constant Current source $I_{REF}$ can be removed during process 800. An ADC control unit with current source $I_{REF}$ can serve for N number of ADCs together. It is further noted that process 800 overcomes the disadvantages of power and AREA.

CONCLUSION

Although the present embodiments have been described with reference to specific example embodiments, various modifications and changes can be made to these embodiments without departing from the broader spirit and scope of the various embodiments. For example, the various devices, modules, etc. described herein can be enabled and operated using hardware circuitry, firmware, software or any combination of hardware, firmware, and software (e.g., embodied in a machine-readable medium).

In addition, it can be appreciated that the various operations, processes, and methods disclosed herein can be embodied in a machine-readable medium and/or a machine accessible medium compatible with a data processing system (e.g., a computer system), and can be performed in any order (e.g., including using means for achieving the various operations). Accordingly, the specification and drawings are to be regarded in an illustrative rather than a restrictive sense. In some embodiments, the machine-readable medium can be a non-transistor form of machine-readable medium.

What is claimed as new and desired to be protected by Letters Patent of the United States is:

1. An analog to digital converter (ADC) for a multiply-accumulator (MAC) system comprising:
    an ADC control that receives a $V_{REF}$ and generates a plurality of timing signals to an ADC, and wherein the plurality of timing signals comprises an S1 signal, an S3 signal, an S4 signal, an ECO signal, a CLOCK signal, and a COUNTER<N:0> signal;
    the ADC that comprises:
        a pre-charge system comprising a sense capacitor that stores an integrated charge $I_{MAC}$ over a time T and develops voltage $V_{MAC}$, and wherein the S1 signal defines the pre-charge phase of the sense capacitor, wherein the sense capacitor is pre-charged to a higher reference voltage $V_{REF}$ before the discharge phase occurs by the $I_{MAC}$ current,
        an isolation/circuit device, wherein the isolation/circuit device is controlled by signal S3, wherein a turned-on isolation device enables the sense capacitor C1 pre-charge to occur though itself and enables a path for the $I_{MAC}$ current to discharge the sense capacitor C1, wherein during the pre-charge and charge accumulation phase isolation the sense capacitor C1 is expected to be turned on, and wherein the isolation device isolates sense capacitor C1 from the pre-charge system,
        a device controlled by the signal S4, wherein the signal S4 transitions from a logic high state to a logic low state which turns off device in order to start the resolution phase,
        a sense node of the sense capacitor C1, wherein the sense node follows a GNDX constant ramp of the ADC control unit at a resolution phase such that when the S3 is also in the logic low state the sense node is at a high impedance,
        a comparator which compares the sense node voltage with $V_{REF}$, can detect and generate an active low output when sense node of the sense capacitor C1 ramps back to the $V_{REF}$ voltage during resolution phase,
        a CMOS logic-based system that received the output of the comparator output, wherein an active high output transition of CMOS logic-based system comprises a detection event when the sense node of sense cap ramps back to $V_{REF}$ during the resolution phase, wherein the CMOS logic-based system detects an ADC output even if there is zero input to the ADC, and wherein the CMOS logic-based system ensures a specified ADC output when the input goes beyond a range instead of a random ADC output, and
        a Master Slave Flip Flop that synchronizes an output of the CMOS logic-based system, and wherein the Master Slave Flip Flop generates a pulse with pulse-width sufficient to latch a counter data and produce the binary ADC output.

2. The ADC for MAC system of claim 1, wherein the ADC control unit comprises a finite state machine (FSM) system.

3. The ADC for MAC system of claim 2,
    wherein the FSM generates the plurality of timing signals using a continuous clock signal as an input and generates CLOCK op at a resolution phase to be used by the ADC.

4. The ADC for MAC system of claim 3, wherein the FSM comprises an N bit counter whose output is the COUNTER<N:0> signal that is used in the ADC.

5. The ADC for MAC system of claim 4, wherein the ADC control unit comprises a GNDX ramping system that ramps a net GNDX at the resolution phase.

6. The ADC for MAC system of claim 5, wherein the GNDX ramping system uses a capacitor C2, and wherein one plate of the capacitor C2 is connected to the $V_{REF}$ and an other plate of capacitor C2 is ramped up with a constant slope defined by an $I_{REF}$.

7. The ADC for MAC system of claim 6, wherein the GNDX ramping system comprises a unity follower system that employs an operation-amplifier-based unity gain buffer.

8. The ADC for MAC system of claim 1, wherein $V_{MAC} = (1/C)I_{MAC} * T$.

9. The ADC for MAC system of claim 1,
wherein the $I_{MAC}$ current is a syncing current which discharges a sense capacitor to develop the voltage $V_{MAC}$, across it.

10. The ADC for MAC system of claim 1,
wherein the isolation device uses a nMOS-based circuit,
wherein during the pre-charge and charge accumulation phase isolation the sense capacitor C1 is expected to be turned on with the S3 signal at a high state, and
wherein when the S3 signal is in a logic low state, the sense node in ADC is at a high impedance state.

11. The ADC of MAC system of claim 1, wherein the device employs an nMOS transistor.

12. The ADC of MAC system of claim 1, wherein the ADC employs D-Latch.

13. The ADC of MAC system of claim 1, wherein the ADC generates a pulse that is used to latch the counter data generated by the control unit.

14. The ADC of MAC system of claim 1, wherein the sense node of sense capacitor C1 ramps up and a resolution is achieved by ramping a bottom plate sense capacitor C1 while maintaining a same voltage across the sense capacitor C1.

15. The ADC of MAC system of claim 1, wherein the COUNTER<N:0> signal drives a plurality of ADCs.

16. The ADC of MAC system of claim 1, wherein an error due a variation in the sense capacitor C1 with a voltage swing is neutralized by special connection of a reference capacitor C2 to ensure a similar variation in a charge accumulation phase and a resolution phase.

* * * * *